United States Patent [19]
Payne et al.

[11] Patent Number: 4,756,940
[45] Date of Patent: Jul. 12, 1988

[54] FLEXIBLE CIRCUIT STRAIN RELIEF

[75] Inventors: David G. Payne, Aloha; Terry L. Baker, Beaverton; Donald J. Fisher, Hillsboro, all of Oreg.

[73] Assignee: Tektronix, Inc., Beaverton, Oreg.

[21] Appl. No.: 843,952

[22] Filed: Mar. 25, 1986

[51] Int. Cl.⁴ .......................... B32B 3/16; H01B 7/00; H05K 1/00
[52] U.S. Cl. ...................................... 428/78; 174/135; 361/398; 428/77; 428/189; 428/209; 428/901; 439/447; 439/449; 439/474
[58] Field of Search ...................... 428/417, 473.5, 77, 428/189, 901, 52, 61, 78, 209; 174/68.5, 135; 439/445, 447, 449, 474, 492–499; 361/398

[56] References Cited

U.S. PATENT DOCUMENTS

| | | | |
|---|---|---|---|
| 2,951,112 | 8/1960 | Dahlgren | 174/135 |
| 4,338,149 | 7/1982 | Quaschen | 428/901 |
| 4,503,285 | 3/1985 | Darms et al. | 428/473.5 |

Primary Examiner—George F. Lesmes
Assistant Examiner—James B. Monroe
Attorney, Agent, or Firm—Francis I. Gray; Boulden G. Griffith

[57] ABSTRACT

A strain relief system for flexible circuits has a tapered cover laminate affixed to either side of the flexible circuit to form a cover laminate/flexible circuit assembly, with the widest portion of the cover laminate being at the point of maximum bending stress of the flexible circuit to provide a stiffer assembly at that point. A rigid stiffener having a bending radius also is affixed to either side of the cover laminate/flexible circuit assembly at the point of maximum bending stress to provide strain relief, the bending radii being laterally offset from each other so that bending in opposite directions occurs at different locations of the flexible circuit. The result is a gentle, low stress bend in the flexible circuit when subjected to regular bending.

3 Claims, 1 Drawing Sheet

U.S. Patent   Jul. 12, 1988   4,756,940
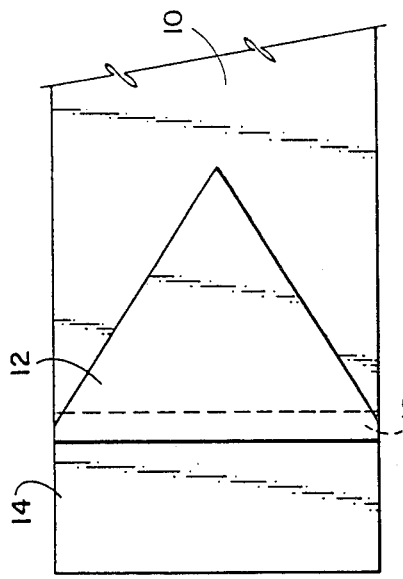
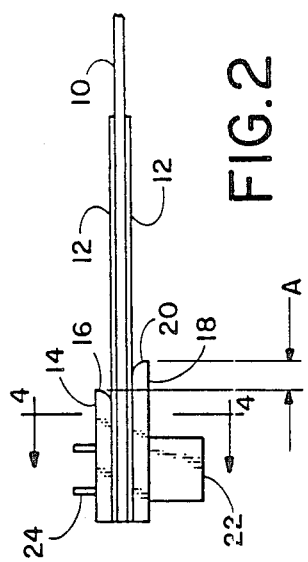
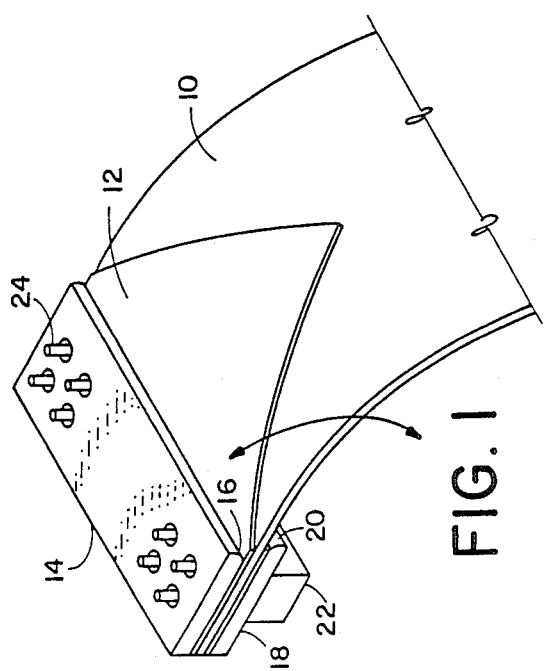
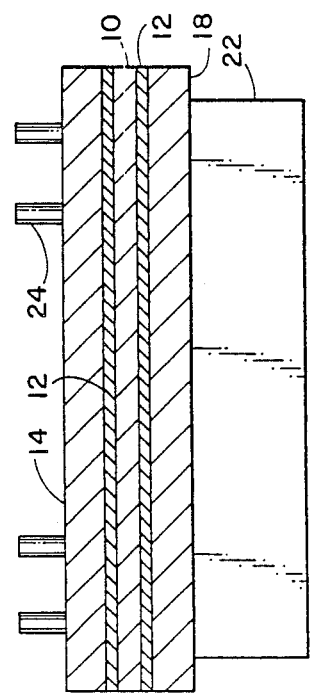

FLEXIBLE CIRCUIT STRAIN RELIEF

BACKGROUND OF THE INVENTION

The present invention relates to a strain relief system for electrical circuits, and more particularly to a strain relief system for flexible circuits.

Flexible circuits are by their nature subjected to dynamic flexing. Specifically, the conductors of the flexible circuit are subjected to work hardening and premature breakage when they are repeatedly bent, or are bent in solder connection areas. What is desired is a means for reducing the strain on the conductors when subjected to flexing so as to extend the life of the flexible circuit.

SUMMARY OF THE INVENTION

Accordingly, the present invention provides a strain relief system which uses cover laminates and rigid stiffeners to improve the dynamic flex life of flexible circuits. Rigid stiffeners having bend radii are located on either side of the flexible circuit to provide a bending surface, the radii being offset from each other so that the stress of bending in each direction is at different locations of the flexible circuit. A cover laminate is located on either side of the flexible circuit between the rigid stiffeners, and tapers from a relatively large width at the rigid stiffeners to a small width, or point, at the ends to provide greater flexibility as the distance from the rigid stiffeners increases. The result is a gentle, low stress bend in a flexible circuit which is bent regularly.

The objects, advantages and novel features of the present invention will be apparent from the following detailed description when read in conjunction with the appended claims and attached drawing.

BRIEF DESCRIPTION OF THE DRAWING

FIG. 1 is a perspective view of the present invention used in conjunction with a typical connector for a flexible circuit.

FIG. 2 is a side plan view of the connector of FIG. 1.

FIG. 3 is a top plan view of the connector of FIG. 1.

FIG. 4 is a cross-sectional view of the connector of FIG. 2 taken along the line 4—4.

DESCRIPTION OF THE PREFERRED EMBODIMENT

Referring now to FIGS. 1-4 a flexible circuit, or flexible probe cable, 10 is shown. On either or both sides of the flexible circuit 10 is a tapered cover laminate 12 which is wider at the point of maximum flex stress and which makes the flexible circuit/cover laminate assembly stiffer than the flexible circuit alone. A first rigid stiffener 14 is placed on top of the flexible circuit 10/cover laminate 12 assembly and has a bend radius 16 about which the assembly can bend in one direction. For those applications for which bending in both directions is anticipated, a second rigid stiffener 18 is placed on the bottom of the flexible circuit 10/cover laminate 12 assembly and has a bend radius 20 about which the assembly can bend in the opposite direction. When two stiffeners are employed, as in the preferred embodiment, it is desirable to offset the bend radii, 16 and 20, from each other by a distance "A" so that the flexure in opposite directions produces bending at different locations of the flexible circuit 10. A typical connector 22 having electrical connection pins 24 is attached to the flexible circuit 10 through the rigid stiffeners 14, 18 and the cover laminates 12 by conventional means.

The cover laminates 12 may be made of a material, such as 0.002"–0.005" polyimide, which when laminated to the flexible circuit 10 provides some bending at their widest point near the rigid stiffeners 14, 18, but which become more flexible with increasing distance from the rigid stiffeners due to the taper.

The rigid stiffeners 14, 18 may be made of a material, such as 0.062" fiberglass reinforced epoxy laminate, which provides the strain relief. Due to the offset "A", typically on the order of 0.150"–0.200", between the radii 16, 20 only half the bending stresses occur in any of the two possible locations. The dimensions of the bending radii 16, 20 are a function of the amount of bending to which the flexible circuit 10 is to be subjected, i.e., if the flexible circuit will be bent through 90° the dimensions of the radii will be equal to the thickness of the rigid stiffeners 14, 18 while if the flexible circuit will be bent through 180° the dimenions of the radii will be equal to half of the thickness of the rigid stiffeners. The entire combination may be affixed together using standard hot lamination with pressure technology, or the cover laminates 12 may be affixed to the flexible circuit 10 using the hot lamination technology while the rigid stiffeners 14, 18 may be affixed via an adhesive bond or mechanical hardware, as is well known in the art.

Thus, the present invention provides a strain relief system which realizes up to forty (40) times improvement in the bending life of flexible circuits by allowing a gentle, low stress bend in such circuits.

What is claimed is:

1. A strain relief system for a flexible circuit comprising:
   a cover laminate affixed to the flexible circuit at the point of maximum bending stresses, the cover laminate making the cover laminate and flexible circuit assembly less flexible than the flexible circuit alone, and with the width of the cover laminate decreasing with distance from the point of maximum bending stresses so that the assembly is least flexible at the point of maximum bending stresses but more flexible at distances further away from the point of maximum bending stresses; and
   a rigid stiffener affixed to the cover laminate and flexible circuit assembly, the rigid stiffener having a bend radius about which the cover laminate and flexible circuit assembly may bend, defining the point of maximum bending stresses.

2. A strain relief system as recited in claim 1 wherein the rigid stiffener comprises:
   a top portion affixed to the top surface of the cover laminate and flexible circuit assembly, the top portion having a first bend radius; and
   a bottom portion affixed to the bottom surface of the cover laminate and flexible circuit assembly, the bottom portion having a second bend radius, the first and second bend radii being offset laterally with respect to each other so that only half the bending stresses occur at a particular location on the cover laminate and flexible circuit assembly.

3. A strain relief system as recited in claim 1 wherein the cover laminate comprises two tapered portions on either side of the flexible circuit, the greatest width of the tapered portions being at the point of maximum bending stresses.

* * * * *